United States Patent
Lee

(10) Patent No.: US 8,232,134 B2
(45) Date of Patent: Jul. 31, 2012

(54) RAPID THERMAL METHOD AND DEVICE FOR THIN FILM TANDEM CELL

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 106 days.

(21) Appl. No.: 12/558,108

(22) Filed: Sep. 11, 2009

(65) Prior Publication Data
US 2011/0244623 A1 Oct. 6, 2011

Related U.S. Application Data

(60) Provisional application No. 61/101,642, filed on Sep. 30, 2008.

(51) Int. Cl.
*H01L 21/00* (2006.01)
(52) U.S. Cl. ........................................... 438/85
(58) Field of Classification Search .................. 438/57, 438/74, 98, 85; 257/E25.006, E25.007; 136/243
See application file for complete search history.

(56) References Cited

U.S. PATENT DOCUMENTS

| | | | |
|---|---|---|---|
| 4,239,553 A | 12/1980 | Barnett et al. | |
| 4,658,086 A | 4/1987 | McLeod et al. | |
| 4,782,377 A | 11/1988 | Mahan | |
| 4,996,108 A | 2/1991 | Divigalpitiya et al. | |
| 5,125,984 A | 6/1992 | Kruehler et al. | |
| 5,261,968 A | 11/1993 | Jordan | |
| 5,261,969 A | 11/1993 | Stanbery | |
| 5,397,401 A | 3/1995 | Toma et al. | |
| 5,501,744 A | 3/1996 | Albright et al. | |
| 5,536,333 A | 7/1996 | Foote et al. | |
| 5,578,503 A | 11/1996 | Karg et al. | |
| 5,665,175 A | 9/1997 | Safir | |

(Continued)

FOREIGN PATENT DOCUMENTS
WO WO 2010/025291 A2 3/2010
(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — Kevin M Picardat
*Assistant Examiner* — Neil Prasad
(74) *Attorney, Agent, or Firm* — Kilpatrick Townsend & Stockton LLP

(57) ABSTRACT

A method for forming a thin film photovoltaic device. The method includes providing a transparent substrate comprising a surface region. A first transparent electrode layer is formed overlying the surface region. A multilayered structure including a copper material and an indium material is formed overlying a electrode surface region. The multilayered structure is subjected to a plurality of sulfur bearing entities during a rapid thermal process to form an absorber material comprising a copper entity, an indium entity, and a sulfur entity. The rapid thermal process uses a ramp time ranging from about 10 Degrees Celsius/second to about 50 Degrees Celsius/second. In a specific embodiment, the first transparent electrode layer is maintained to a sheet resistance of less than or equal to about 10 Ohms/square centimeters and an optical transmission of 90 percent and greater.

23 Claims, 17 Drawing Sheets

U.S. PATENT DOCUMENTS

| | | | |
|---|---|---|---|
| 5,733,382 | A | 3/1998 | Hanoka |
| 5,834,331 | A * | 11/1998 | Razeghi .......................... 438/40 |
| 6,040,521 | A * | 3/2000 | Kushiya et al. ............... 136/265 |
| 6,288,325 | B1 | 9/2001 | Jansen et al. |
| 6,310,281 | B1 | 10/2001 | Wendt et al. |
| 6,320,115 | B1 | 11/2001 | Kataoka et al. |
| 6,328,871 | B1 | 12/2001 | Ding et al. |
| 6,350,946 | B1 | 2/2002 | Miyake et al. |
| 6,548,751 | B2 * | 4/2003 | Sverdrup et al. ............. 136/260 |
| 7,141,863 | B1 | 11/2006 | Compaan et al. |
| 7,855,089 | B2 | 12/2010 | Farris, III et al. |
| 7,863,074 | B2 | 1/2011 | Wieting |
| 7,910,399 | B1 | 3/2011 | Wieting |
| 2002/0038663 | A1 | 4/2002 | Zenko et al. |
| 2003/0227017 | A1 | 12/2003 | Yasuno |
| 2005/0056312 | A1 | 3/2005 | Young et al. |
| 2005/0150542 | A1 | 7/2005 | Madan |
| 2006/0037641 | A1 | 2/2006 | Kibbel et al. |
| 2006/0130890 | A1 | 6/2006 | Hantschel et al. |
| 2006/0220059 | A1 | 10/2006 | Satoh et al. |
| 2007/0089782 | A1 | 4/2007 | Scheuten et al. |
| 2007/0151596 | A1 | 7/2007 | Nasuno et al. |
| 2007/0160770 | A1 | 7/2007 | Stanbery |
| 2007/0169810 | A1 | 7/2007 | Van Duren et al. |
| 2008/0041446 | A1 | 2/2008 | Wu et al. |
| 2008/0092945 | A1 | 4/2008 | Munteanu et al. |
| 2008/0092953 | A1 | 4/2008 | Lee |
| 2008/0173390 | A1 | 7/2008 | Narasimhan et al. |
| 2009/0020149 | A1 | 1/2009 | Woods et al. |
| 2009/0301562 | A1 | 12/2009 | Lee |
| 2009/0308437 | A1 | 12/2009 | Woods et al. |
| 2010/0051090 | A1 | 3/2010 | Lee |
| 2010/0078059 | A1 | 4/2010 | Lee |
| 2010/0099214 | A1 * | 4/2010 | Buquing .......................... 438/69 |
| 2010/0229921 | A1 | 9/2010 | Farris, III et al. |
| 2010/0307552 | A1 * | 12/2010 | Kohnke et al. ............... 136/243 |
| 2011/0017257 | A1 | 1/2011 | Lee |
| 2011/0017298 | A1 | 1/2011 | Lee |

FOREIGN PATENT DOCUMENTS

| | | |
|---|---|---|
| WO | WO 2010/039727 A1 | 4/2010 |
| WO | WO 2010/107705 A1 | 9/2010 |

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Martil et al., "Growth and physical properties of CuGaSe2 thin films by r.f. sputtering", Journal of Materials Science Letter, vol. 19, 1990, pp. 237-240.

Rostan, et al. "Formation of Transparent and Ohmic ZnO:Al/MoSe2 Contacts for Bifacial Cu (in, Ga)Se2 Solar Cells and Tandem Structures", Thin Solid Films, vol. 480-481, pp. 67-70, 2005.

Symko-Davies, "NREL High-Performance Photovoltaic Project Kickoff Meeting", Oct. 18, 2001, 121 pages.

International Search Report and Written Opinion for PCT Application No. PCT/US2010/27342, mailed on May 17, 2010, 13 pages.

International Search Report & Written Opinion of PCT Application No. PCT/US2009/58829, mailed on Nov. 25, 2009, 12 pages.

Non-Final Office Action of Dec. 23, 2010 for U.S. Appl. No. 12/512,978, 13 pages.

Final Office Action of Dec. 23, 2010 for U.S. Appl. No. 12/475,858, 28 pages.

Non-Final Office Action of Dec. 22, 2010 for U.S. Appl. No. 12/271,704 14 pages.

Non-Final Office Action of Sep. 2, 2010 for U.S. Appl. No. 12/562,086; 14 pages.

Non-Final Office Action of Aug. 30, 2010 for U.S. Appl. No. 12/512,979, 13 pages.

Non-Final Office Action on Aug. 17, 2010 for U.S. Appl. No. 12/475,858, 17 pages.

International Search Report and Written Opinion for PCT Application No. PCT/US2009/055243, mailed on Mar. 11, 2011, 11 pages.

Gee, J.M., et al., "A 31%-Efficient GaAs/ Silicon Mechanically Stacked, Multijunction Concentrator Solar Cell", 20th IEEE Photovoltaic Specialist Conference, IEEE Publishing, New York, NY, 1988, pp. 754-758.

Meyers, P.V., et al., "Polycrystalline CdTe on CuInSe2 Cascaded Solar Cells", Conference Record of the Twentieth IEEE Photovoltaic Specialists Conference, Las Vegas, NV, Sep. 26-30, 1988, pp. 1448-1451, vol. 2.

Schorr, S., et al., "Electronic Band Gap of $Zn_{2x}(CuIn)_{1-x}X_2$ Solid Solution Series (X=S, Se, Te)", Journal of Alloys and Compounds, Elsevier Sequoia, Lausanne, CH, Apr. 13, 2006, pp. 26-30, vol. 414, No. 1-2.

Wu, X., et al. "13.9%-Efficient CdTe Polycrystalline Thin-Film Solar Cells with an Infrared Transmission of ~ 50%", Progress in Photovoltaics: Research and Applications, Dec. 30, 2005, pp. 471-483, vol. 14, No. 6.

Young, D. L., et al. "Interconnect Junctions for Thin-Film Tandem Solar Cells", Proceedings of the 3rd World Conference on Photovoltaic Energy Conversion, Osaka, Japan, May 11-18, 2003, pp. 27-30, vol. 1.

Final Office Action of May 12, 2011 for U.S. Appl. No. 12/512,979, 14 pages.

Final Office Action of Apr. 12, 2011 for U.S. Appl. No. 12/562,086, 26 pages.

* cited by examiner

RAPID THERMAL METHOD AND DEVICE FOR THIN FILM TANDEM CELL

CROSS-REFERENCES TO RELATED APPLICATIONS

This application claims priority to U.S. Provisional Patent Application No. 61/101,642, filed Sep. 30, 2008, entitled "RAPID THERMAL METHOD AND DEVICE FOR THIN FILM TANDEM CELL" by inventor HOWARD W. H. LEE, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials and manufacturing method. More particularly, the present invention provides a method and structure for manufacture of high efficiency thin film photovoltaic cells. Merely by way of example, the present method and materials include absorber materials made of copper indium disulfide species, copper tin sulfide, iron disulfide, or others for single junction cells or multi junction cells.

From the beginning of time, mankind has been challenged to find a way of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a structure for forming thin film semiconductor materials for photovoltaic applications are provided. More particularly, embodiments according to the present invention provide a method and structure for forming a thin film photovoltaic cell for use in a tandem cell configuration, but can also be used in others. Merely by way of example, the present method and materials include materials made of copper indium disulfide species, copper tin sulfide, iron disulfide, and the like, to form a thin film tandem photovoltaic cell. But it would be recognize that the photovoltaic cell can have other configuration.

In a specific embodiment, a method for forming a thin film photovoltaic device is provided. The method includes providing a transparent substrate comprising a surface region. The method forms a first transparent electrode layer overlying the surface region of the transparent substrate. The first transparent electrode layer includes an electrode surface region. In a specific embodiment, the method forms a multilayered structure including a copper material and an indium material overlying the electrode surface region. In a specific embodiment, the method subjects the multilayered structure to a plurality of sulfur bearing entities and subjecting the multilayered structure to a rapid thermal process. In a specific embodiment, using a ramp time ranging from about 10 Degrees Celsius/second to about 50 Degrees Celsius/second during the subjecting of the sulfur bearing entities to form an absorber material comprising a copper entity, an indium entity, and a sulfur entity; and maintaining the first transparent electrode layer to a sheet resistance of less than or equal to about 10 Ohms/square centimeters and an optical transmission of 90 percent and greater.

Many benefits are achieved by ways of present invention. For example, the present invention uses starting materials that are commercially available to form a thin film of semiconductor bearing material overlying a suitable substrate member. The thin film semiconductor bearing material can be further processed to form a semiconductor thin film material of desired characteristics, such as atomic stoichiometry, impurity concentration, carrier concentration, doping, and others. In a specific embodiment, the band gap of a resulting copper indium disulfide material is about 1.55 eV. Additionally, the present method uses environmentally friendly materials that are less toxic than other thin-film photovoltaic materials. In a preferred embodiment, the method and resulting device includes a transparent conductor layer suitable for a top cell. The transparent conductor layer has an optical transmission of 90% and greater and a resistivity of less than about 10 ohms per centimeter square according to a specific embodiment. Merely by way of example, the present method and materials include absorber materials made of copper indium disulfide species, copper tin sulfide, iron disulfide, or others for single junction cells or multi junction cells.

Depending on the embodiment, one or more of the benefits can be achieved. These and other benefits will be described in more detail throughout the present specification and particularly below.

DETAILED DESCRIPTION OF THE INVENTION

According to embodiments of the present invention, a method and structure for forming semiconductor materials for photovoltaic applications are provided. More particularly, the present invention provides a method for manufacturing thin film photovoltaic devices for use in tandem solar cell configurations, but can also be used in others. Merely by way of example, the method has been used to provide a copper indium disulfide thin film material for high efficiency solar cell application. But it would be recognized that the present invention has a much broader range of applicability, for example, embodiments of the present invention may be used to form other semiconducting thin films or multilayers comprising iron sulfide, cadmium sulfide, zinc selenide, and others, and metal oxides such as zinc oxide, iron oxide, copper oxide, and others.

Figure 1:
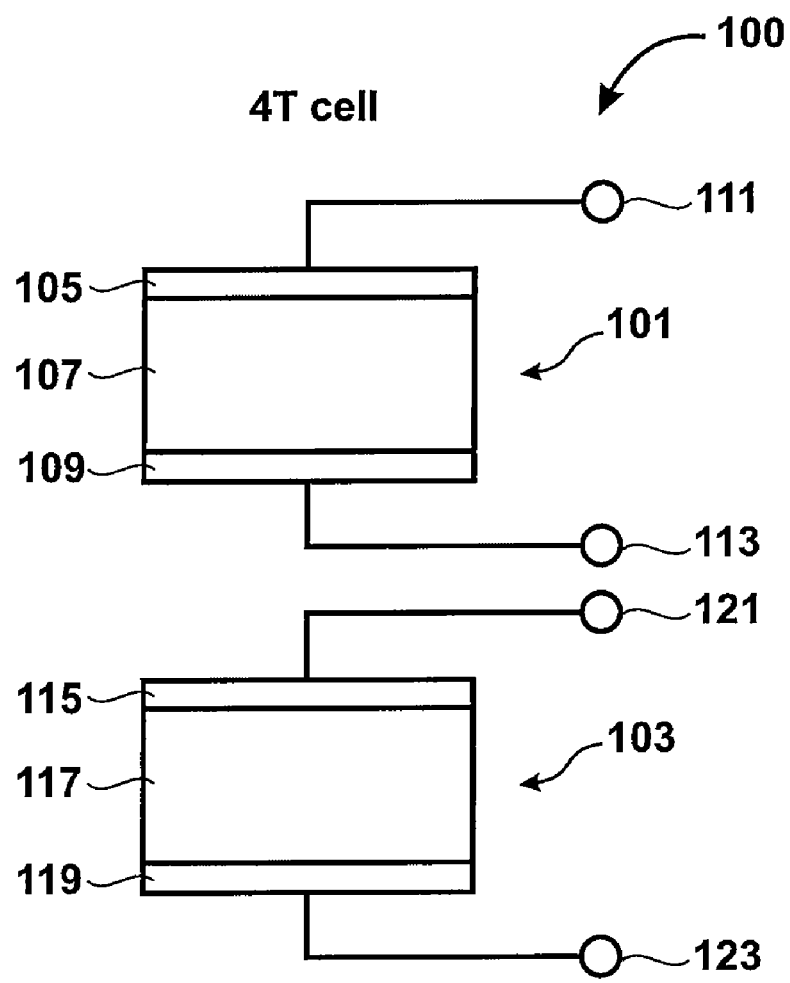
FIG. 1 is a simplified diagram of a tandem photovoltaic cell according to an embodiment of the present invention.

FIG. 1 is a simplified diagram of a tandem photovoltaic cell according to an embodiment of the present invention. The diagram is merely an illustration and should not unduly limit the scope of the claims herein. One of ordinary skill in the art would recognize other variations, modifications, and alternatives. As an example, the tandem photovoltaic cell can also be described in U.S. Provisional No. 61/092,732, Attorney Docket number 026335-003400US), commonly assigned, and hereby incorporated by reference herein. As shown, a four terminal tandem photovoltaic cell device 100 is provided. The four terminal tandem photovoltaic cell includes a lower cell 103 and an upper cell 101 operably coupled to the lower cell. The terms "lower" and "upper" are not intended to be limiting but should be construed by plain meaning by one of ordinary skill in the art. In general, the upper cell is closer to a source of electromagnetic radiation than the lower cell, which receives the electromagnetic radiation after traversing through the upper cell. Of course, there can be other variations, modifications, and alternatives.

In a specific embodiment, the lower cell includes a lower glass substrate material 119, e.g., a transparent glass material. The lower cell also includes a lower electrode layer made of a reflective material overlying the lower glass substrate material. The lower cell includes a lower absorber layer overlying the lower electrode layer. As shown, the absorber and electrode layer are illustrated by reference numeral 117. In a specific embodiment, the absorber layer is made of a semiconductor material having a band gap energy Eg in a range of about 1.2 eV to about 2.2 eV and preferably in a range of about 1.6 eV to about 1.9 eV, but can be others. In a specific embodiment, the lower cell includes a lower window layer overlying the lower absorber layer and a lower transparent conductive oxide layer 115 overlying the lower window layer.

In a specific embodiment, the upper cell includes a p+ type transparent conductor layer 109 overlying the lower transparent conductive oxide layer. In a preferred embodiment, the p+ type transparent conductor layer is characterized by a sheet resistance of less than or equal to about 10 Ohms/square centimeters and an optical transmission of 90 percent and greater. In a specific embodiment, the upper cell has an upper p type absorber layer overlying the p+ type transparent conductor layer. In a preferred embodiment, the p type conductor layer made of a semiconductor material has a band gap energy Eg in a range of about 1.2 eV to about 2.2 eV and preferably in a range of about 1.6 eV to about 1.9 eV, but can be others. The upper cell also has an upper n type window layer overlying the upper p type absorber layer. Referring again to FIG. 1, the window and absorber layer for the upper cell are illustrated by reference numeral 107. The upper cell also has an upper transparent conductive oxide layer 105 overlying the upper n type window layer and an upper glass material (not shown) overlying the upper transparent conductive oxide layer. Of course, there can be other variations, modifications, and alternatives.

In a specific embodiment, the tandem photovoltaic cell includes four terminals. The four terminals are defined by reference numerals 111, 113, 121, and 123. Alternatively, the tandem photovoltaic cell can also include three terminals, which share a common electrode preferably proximate to an interface region between the upper cell and the lower cell. In other embodiments, the multi junction cell can also include two terminals, among others, depending upon the application. Examples of other cell configurations are provided in U.S. Provisional Patent Application No. 61/092,383, Attorney Docket No: 026335-001600US, commonly assigned and hereby incorporated by reference herein. Of course, there can be other variations, modifications, and alternatives. Further details of the four terminal cell can be found throughout the present specification and more particularly below.

Figure 2:
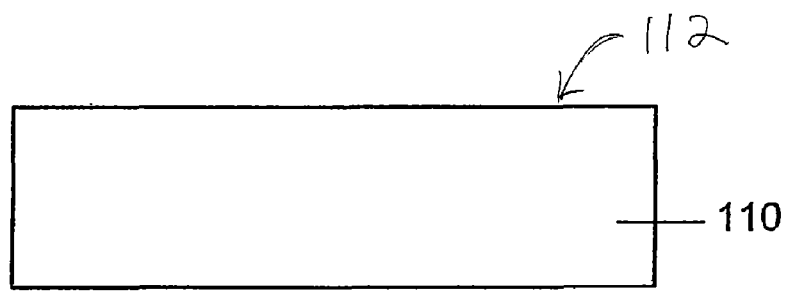
FIGS. 2 through 9 are schematic diagrams illustrating a method and structure for forming a thin film photovoltaic device according to an embodiment of the present invention.

FIG. 2-17 are a schematic diagrams illustrating a method for forming a top cell for a thin film tandem photovoltaic device according to an embodiment of the present invention. These diagrams are merely examples, which should not unduly limit the claims herein. One skilled in the art would recognize other variations, modifications, and alternatives. As shown in FIG. 2, a substrate 110 is provided. In an embodiment, the substrate includes a surface region 112 and is held in a process stage within a process chamber (not shown). In another embodiment, the substrate is an optically transparent solid material. For example, the substrate can be a glass, quartz, fused silica, or a plastic, or metal, or foil, or semiconductor, or other composite materials. Depending upon the embodiment, the substrate can be a single material, multiple materials, which are layered, composites, or stacked, including combinations of these, and the like. Of course there can be other variations, modifications, and alternatives.

Figure 3:
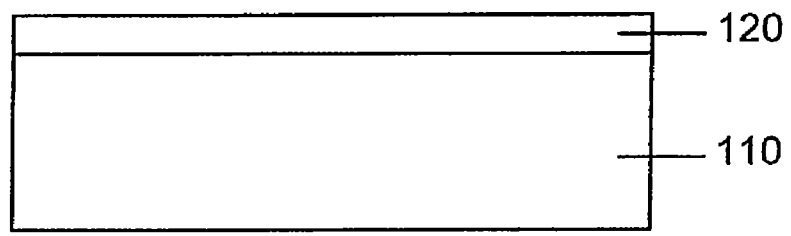

As shown in FIG. 3, the method includes forming a first electrode layer 120 overlying the surface region of the substrate. The first electrode layer can be formed using a suitable metal material such as molybdenum, or tungsten, but can be others. These other metal materials may include copper, chromium, aluminum, nickel, platinum, or others. Such metal material can be deposited using techniques such as sputtering, evaporation (e.g., electron beam), electro plating, combination of these and the like in a specific embodiment. A thickness of the first electrode layer can range from about 100 nm to 2 micron, but can be others. First electrode layer 120 is preferably characterized by a resistivity of about 10 Ohm/cm2 and less according to a specific embodiment. In a preferred embodiment, the electrode layer is provided by molybdenum. In a specific embodiment, the first electrode layer may be provided using a transparent conductive oxide (TCO) material such as $In_2O_3$:Sn (ITO), ZnO:Al (AZO), SnO2:F (TFO), but can be others. Of course, there can be other variations, modifications and alternatives.

Figure 4:
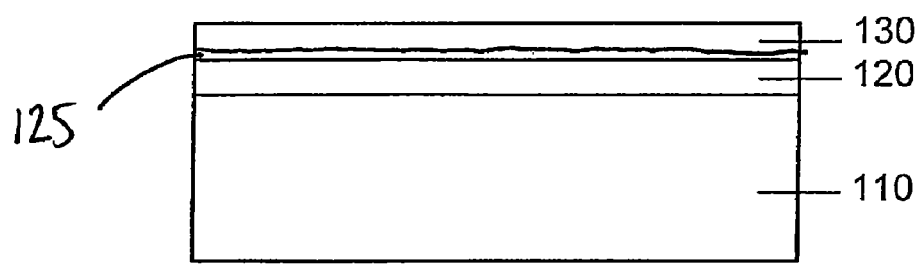

Referring to FIG. 4, the method for forming the thin film photovoltaic cell includes forming a copper layer 130 overlying the electrode layer formed. The copper layer can be formed using a sputtering process such as a DC magnetron sputtering process in a specific embodiment. The DC magnetron sputtering process may be provided at a deposition pressure of about 6.2 mTorr, controlled by using an inert gas such as argon. Such pressure can be achieved using a gas flow rate of about 32 sccm. The sputtering process can be perform at about room temperature without heating the substrate. Of course, minor heating of the substrate may be resulted due to the plasma generated during the deposition process. According to certain embodiments, a DC power in a range from 100 Watts to 150 Watts, and preferably about 115 Watts may be used, depending on the embodiment. A deposition time for a Cu layer of 330 nm thickness can be about 6 minutes or more. Of course, the deposition condition can be varied and modified according to a specific embodiment.

Depending on the embodiment, the method can form a barrier layer 125 overlying the electrode layer to form an interface region between the electrode layer and the copper layer. In a specific embodiment, the interface region is maintained substantially free from a metal disulfide layer having a semiconductor characteristic that is different from the copper indium disulfide material during later processing steps. Depending upon the embodiment, the barrier layer has suitable conductive characteristics and can be reflective to allow electromagnetic radiation to reflect back or can also be transparent or the like. In a specific embodiment, the barrier layer is selected from platinum, titanium, chromium, or silver. Of course, there can be other variations, modifications, and alternatives.

Figure 5:
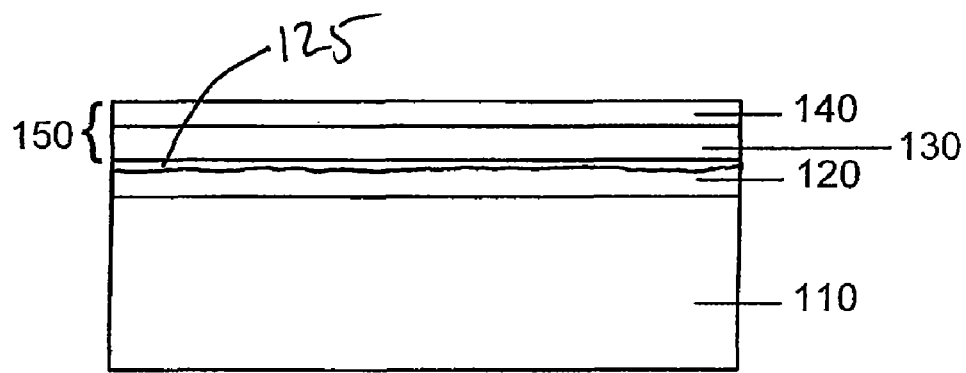
Figure 6:
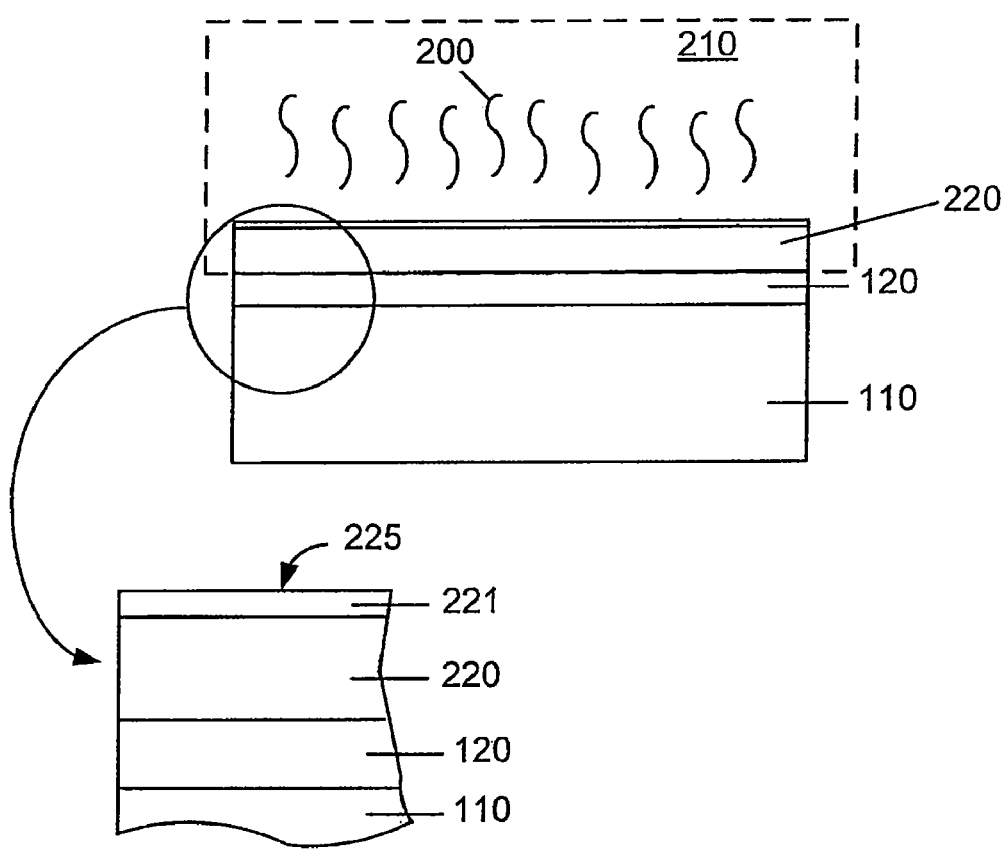

As shown in FIG. 5, the method includes providing an indium (In) layer 140 overlying the copper layer. In particular, the indium layer 140 is formed overlying the copper layer 130. The indium layer is deposited over the copper layer using a sputtering process. In one example, the indium layer is deposited using a DC magnetron sputtering process is under a similar process condition for depositing the Cu layer. The deposition time for the indium layer may be shorter than that for Cu layer. For example, 2 minutes and 45 seconds may be sufficient for depositing an In layer of a thickness of about 410 nm according to a specific embodiment. Other suitable deposition methods such as electroplating or others may also be used depending on the embodiment.

In a specific embodiment, the copper layer and the indium layer form a multilayer structure for the thin film photovoltaic cell. In a specific embodiment, the copper layer and the indium layer are provided in a certain stoichiometry that forms a copper rich material having a copper to indium atomic ratio ranging from about 1.2:1 to about 2.0:1. In an alternative embodiment, the copper to indium atomic ratio ranges from about 1.35:1 to about 1.60:1. In another embodiment, the copper to indium atomic ratio is selected to be 1.55:1. In a preferred embodiment, the copper to indium atomic ratio provides a copper rich film for the photovoltaic cell In another specific embodiment, the indium layer is deposited overlying the electrode layer prior to the deposition of the copper layer. Of course there can be other variations, modifications, and alternatives.

As shown in FIG. 5, the multilayered structure 150 comprising at least an indium layer and a copper layer is subjected to a thermal treatment process 200 in an sulfur species 210 bearing environment. The thermal treatment process uses a rapid thermal process while the multilayer structure is subjected to the sulfur bearing species. In a specific embodiment, the rapid thermal process uses a temperature ramp rate ranging from about 10 Degrees Celsius/second to about 50 Degrees Celsius/second to a final temperature ranging from about 400 Degrees Celsius to about 600 Degrees Celsius. In a specific embodiment, the thermal treatment process further maintains at the final temperature for a dwell time ranging from about 1 minute to about 10 minutes, but can be others. The thermal treatment process also include a temperature ramp down in an inert ambient or other suitable environment. The inert ambient can be provided using gases such as nitrogen, argon, helium, and others, which stops reaction to alloy the metal material with the sulfur species. Further details of the temperature ramp process is described throughout the present specification and more particularly below.

In a specific embodiment, the sulfur bearing species can be applied using a suitable technique. In an example, the sulfur bearing species are in a fluid phase. As an example, the sulfur can be provided in a solution, which has dissolved $Na_2S$, $CS_2$, $(NR_4)_2S$, thiosulfate, and others. Such fluid based sulfur species can be applied overlying one or more surfaces of the multilayered copper/indium structure according to a specific embodiment. In another example, the sulfur bearing species 210 is provided by hydrogen sulfide gas or other like gas. In other embodiments, the sulfur can be provided in a solid phase, for example elemental sulfur. In a specific embodiment, elemental sulfur can be heated and allowed to vaporize into a gas phase, e.g., $S_n$, and allowed to react with the indium/copper layers. Other sulfur bearing species may also be used depending on the embodiment. Taking hydrogen sulfide gas as the sulfur bearing species as an example. The hydrogen sulfide gas can be provided using one or more entry valves with flow rate control into a process chamber. Any of these application techniques and other combinations of techniques can also be used. The process chamber may be equipped with one or more pumps to control process pressure. Depending on the embodiment, a layer of sulfur material may be provided overlying the multilayer structure comprising the copper layer and the indium layer. The layer of sulfur material can be provided as a patterned layer in a specific embodiment. In other embodiment, sulfur material may be provided in a slurry, a powder, a solid, a paste, a gas, any combination of these, or other suitable form. Of course, there can be other variations, modifications, and alternatives.

Referring again to FIG. 6, the thermal treatment process cause a reaction between copper indium material within the multilayered structure and the sulfur bearing species 210, thereby forming a layer of copper indium disulfide thin film material 220. In one example, the copper indium disulfide material is formed by incorporating sulfur ions and/or atoms evaporated or decomposed from the sulfur bearing species into the multilayered structure with indium atoms and copper atoms mutually diffused therein. In a specific embodiment, the thermal treatment process results in a formation of a cap layer overlying the copper indium disulfide material. The cap layer comprises a thickness of substantially copper sulfide material 221 substantially free of indium atoms. The copper sulfide material 221 includes a surface region 225. In a specific embodiment, the formation of the copper sulfide cap layer is under a Cu-rich conditions for the Cu-In bearing multilayered structure 150. Depending on the embodiment, the thickness of the copper sulfide material is in an order of about five to ten nanometers and greater depending on the multilayered structure. In a specific embodiment, thermal treatment process allows the first electrode layer using a TCO material to maintain at a sheet resistance of less than or equal to about 10 Ohms per square centimeters and an optical transmission of 90 percent and greater after the copper indium disulfide thin film material is formed. Of course, there can be other variations, modifications, and alternatives.

Figure 7:
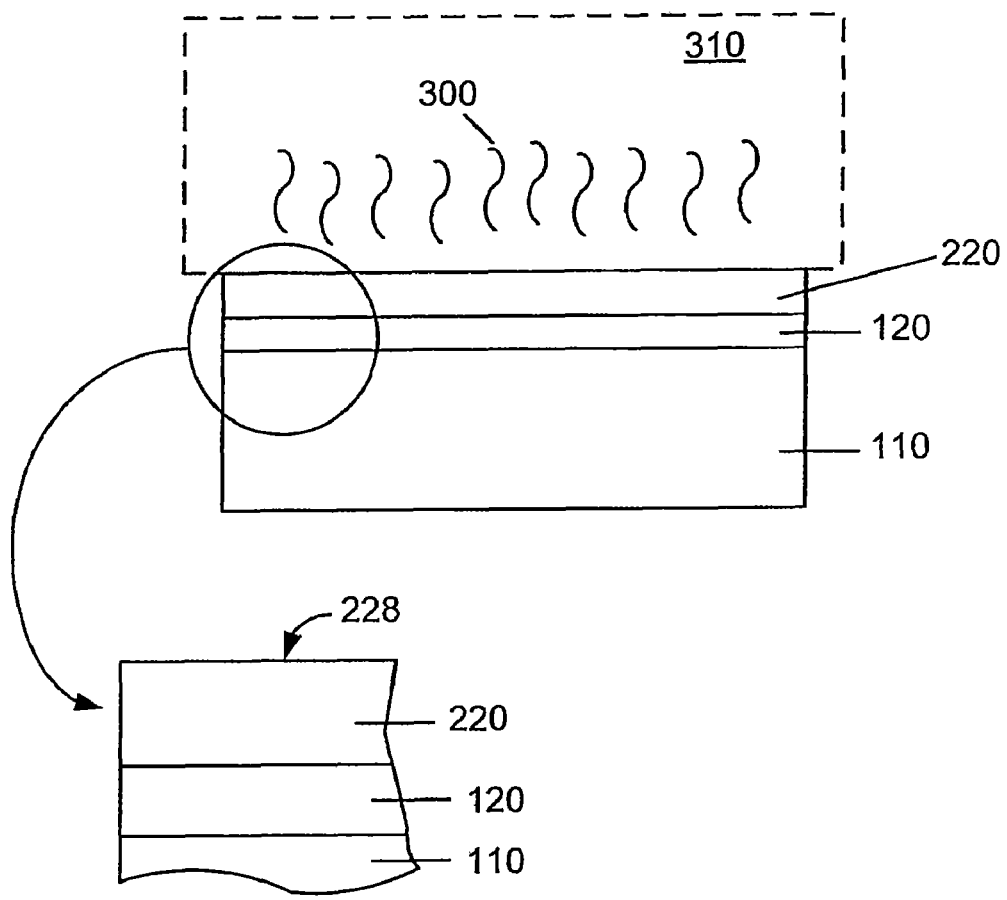
Figure 8:
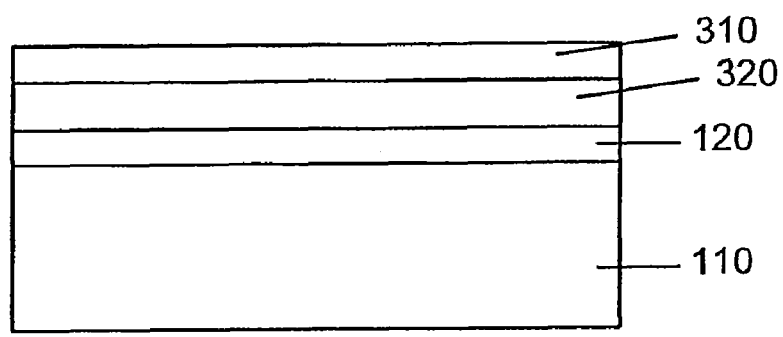

As shown in FIG. 7, copper sulfide material 221 is subjected to a dip process 300. The copper sulfide material overlies copper indium disulfide thin film 220. The dip process is performed by exposing the surface region of the copper sulfide material to about a solution comprising a 10% by weight of potassium cyanide 310 according to a specific embodiment. Potassium cyanide solution provides an etching process to selectively remove copper sulfide material 221 from the copper indium disulfide material surface exposing a surface region 228 of underlying copper indium disulfide material according to a specific embodiment. In a preferred embodiment, the etch process has a selectivity of about 1:100 or more between copper sulfide and copper indium disulfide. Other etching species can be used depending on the embodiment. In a specific embodiment, the etching species can be hydrogen peroxide. In other embodiments, other etching techniques including electro-chemical etching, plasma etching, sputter-etching, or any combination of these may be used. In a specific embodiment, the copper sulfide material can be mechanically removed, chemically removed, electrically removed, or any combination of these, and others In a specific embodiment, the absorber layer made of copper indium disulfide can have a thickness ranging from about one micron to about 10 microns, but can be others. Of course, there can be other variations, modifications, and alternatives.

In a specific embodiment, the copper indium disulfide film has a p type impurity characteristics. In certain embodiments, the copper indium disulfide material is further subjected to a doping process to adjust a p-type impurity density therein to optimize an I-V characteristic of the high efficiency thin film photovoltaic cells. For example, the copper indium disulfide material may be doped using an aluminum species. In another example, the copper indium disulfide material can be intermixed with a copper indium aluminum disulfide material to form the absorber layer. Of course, there can be other variations, modifications, and alternatives.

Referring again to FIG. 8, the method includes forming a window layer 310 overlying the copper indium disulfide material, which has a p-type impurity characteristics. The window layer can be selected from a group of materials consisting of a cadmium sulfide (CdS), a zinc sulfide (ZnS), zinc selenium (ZnSe), zinc oxide (ZnO), zinc magnesium oxide (ZnMgO), or others. These material may be doped with a suitable impurities to provide for a n+ type impurity characteristic. The window layer and the absorber layer forms an interface region for a PN-junction associated with a photovoltaic cell. The window layer is heavily doped to form a n+-type semiconductor layer. In one example, indium species are used as the doping material for a CdS window layer to cause formation of the n+-type characteristic associated with the window layer. In certain embodiments, ZnO may be used as the window layer. ZnO can be doped with an aluminum species to provide for the n+ impurity characteristics. Depending on the material used, the window layer can range from about 200 nanometers to about 500 nanometers. Of course, there can be other variations, modifications, and alternative.

Figure 9:
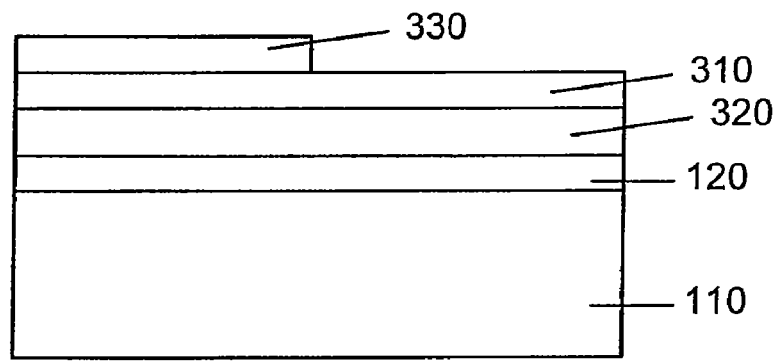

As shown in FIG. 9, a conductive layer 330 is form overlying a portion of a surface region of the window layer. Conductor layer 330 provides a top electrode layer for the thin film photovoltaic cell. In one embodiment, conductive layer 330 is a transparent conductive oxide (TCO). For example, the transparent conductive oxide can be selected from a group consisting of $In_2O_3$:Sn (ITO), ZnO:Al (AZO), SnO2:F (TFO), but can be others. In a specific embodiment, the TCO layer is patterned to maximize the efficiency of the thin film photovoltaic devices. In certain embodiments, the TCO layer can also function as a window layer, which eliminates the need of a separate window layer. Of course there can be other variations, modifications, and alternatives.

Figure 10:
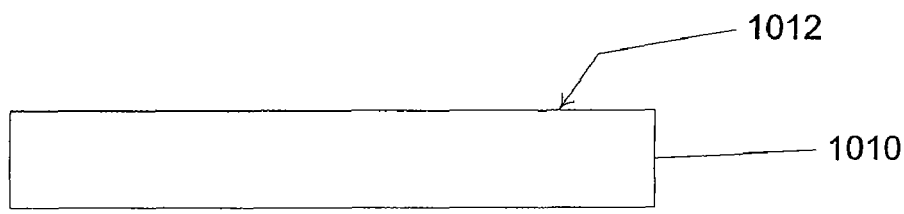
FIGS. 10 through 17 are schematic diagrams illustrating a method and structure for forming a thin film photovoltaic device in a superstrate configuration according to an embodiment of the present invention.

FIG. 10 through 17 are simplified diagrams illustrating a method to form a photovoltaic cell in a superstrate configuration for the thin film tandem photovoltaic cell according to an alternative embodiment of the present invention. These diagrams are merely examples and should not unduly limit the scope of the claims herein. One skilled in the art would recognize other variations, modifications, and alternatives. As shown in FIG. 10, a substrate 1010 is provided. In an embodiment, the substrate includes a surface region 1012 and is held in a process stage within a process chamber (not shown). In a specific embodiment, the transparent substrate is an optically transparent solid material. For example, the optically transparent solid material can be glass, quartz, fused silica, or a polymer material. Other material such as metal, or foil, or semiconductor, or other composite materials may also be used in other embodiments. Depending upon the embodiment, the substrate can be a single material, multiple materials, which are layered, composites, or stacked, including combinations of these, and the like. Of course there can be other variations, modifications, and alternatives.

Figure 11:
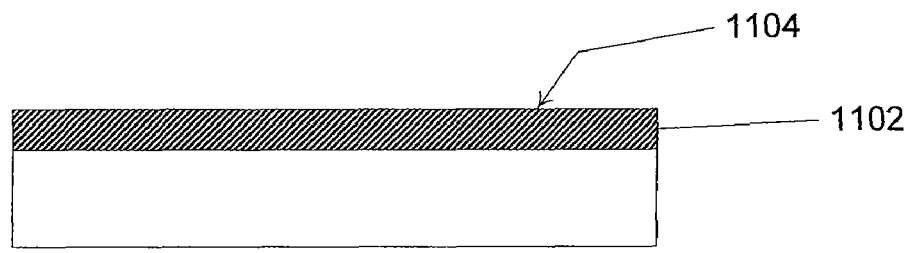

As shown in FIG. 11, the method includes forming a first electrode layer 1102 including a electrode surface region overlying the surface region of the substrate. The first electrode layer is preferably made of a transparent conductive oxide, commonly called TCO. For example, the transparent conductive oxide can be selected from a group consisting of $In_2O_3$:Sn (ITO), ZnO:Al (AZO), SnO2:F (TFO), but can be others. In a specific embodiment, the TCO layer is patterned to maximize the efficiency of the thin film photovoltaic devices. A thickness of the electrode layer can range from about 100 nm to 2 micron, but can be others. Electrode layer 120 is preferably characterized by a resistivity of less than about 10 Ohm/cm$^2$ according to a specific embodiment. Of course there can be other variations, modifications, and alternatives.

Figure 12:

In a specific embodiment, the method includes forming a window layer 1202 overlying the first electrode layer as shown in FIG. 12. The window layer can be selected from a group of materials consisting of a cadmium sulfide (CdS), a zinc sulfide (ZnS), zinc selenium (ZnSe), zinc oxide (ZnO), zinc magnesium oxide (ZnMgO), or others. These material may be doped with a suitable impurities to provide for a n+ type impurity characteristic. In one example, indium species are used as the doping material for a CdS window layer to cause formation of the n+-type characteristic associated with the window layer. In certain embodiments, ZnO may be used as the window layer. ZnO can be doped with an aluminum species to provide for the n+ impurity characteristics. Depending on the material used, the window layer can range from about 200 nanometers to about 500 nanometers. Of course, there can be other variations, modifications, and alternative.

Figure 13:
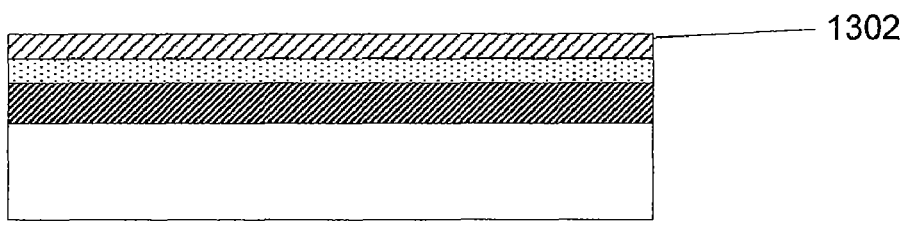

Referring to FIG. 13, the method includes providing a copper layer 1302 overlying the window layer. The copper layer can be formed using a sputtering process such as a DC magnetron sputtering process in a specific embodiment. The DC magnetron sputtering process may be provided at a deposition pressure of about 6.2 mTorr, controlled by using an inert gas such as argon. Such pressure can be achieved using a gas flow rate of about 32 sccm. The sputtering process can be perform at about room temperature without heating the substrate. Of course, minor heating of the substrate may be resulted due to the plasma generated during the deposition process. According to certain embodiments, a DC power in a range from 100 Watts to 150 Watts, and preferably about 115 Watts may be used, depending on the embodiment. As merely an example, a deposition time for a Cu layer of 330 nm thickness can be about 6 minutes or more. Of course, the deposition condition can be varied and modified according to a specific embodiment.

Figure 14:
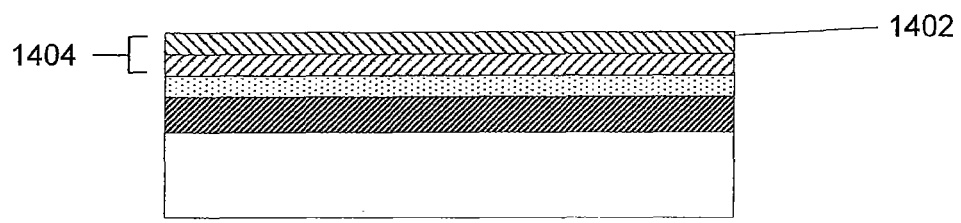

As shown in FIG. 14, the method includes providing an indium (In) layer 1402 overlying the copper layer. The indium layer is deposited over the copper layer using a sputtering process in a specific embodiment. In one example, the indium layer is deposited using a DC magnetron sputtering process is under a similar process condition for depositing the Cu layer. The deposition time for the indium layer may be shorter than that for Cu layer. For example, 2 minutes and 45 seconds may be sufficient for depositing an In layer of a thickness of about 410 nm according to a specific embodiment. Other suitable deposition methods such as electroplating or others may also be used depending on the embodiment.

In a specific embodiment, the copper layer and the indium layer form a multilayer structure 1404 for the thin film photovoltaic cell. In a specific embodiment, the copper layer and the indium layer are provided in a certain stoichiometry that forms a copper rich material In a specific embodiment, the copper rich material can have a copper to indium atomic ratio ranging from about 1.2:1 to about 2.0:1. In an alternative embodiment, the copper to indium atomic ratio ranges from about 1.35:1 to about 1.60:1. In another embodiment, the copper to indium atomic ratio is selected to be 1.55:1. In a preferred embodiment, the copper to indium atomic ratio provides a copper rich film for the photovoltaic cell In another specific embodiment, the indium layer is deposited overlying the electrode layer prior to the deposition of the copper layer. Of course there can be other variations, modifications, and alternatives.

Figure 15:
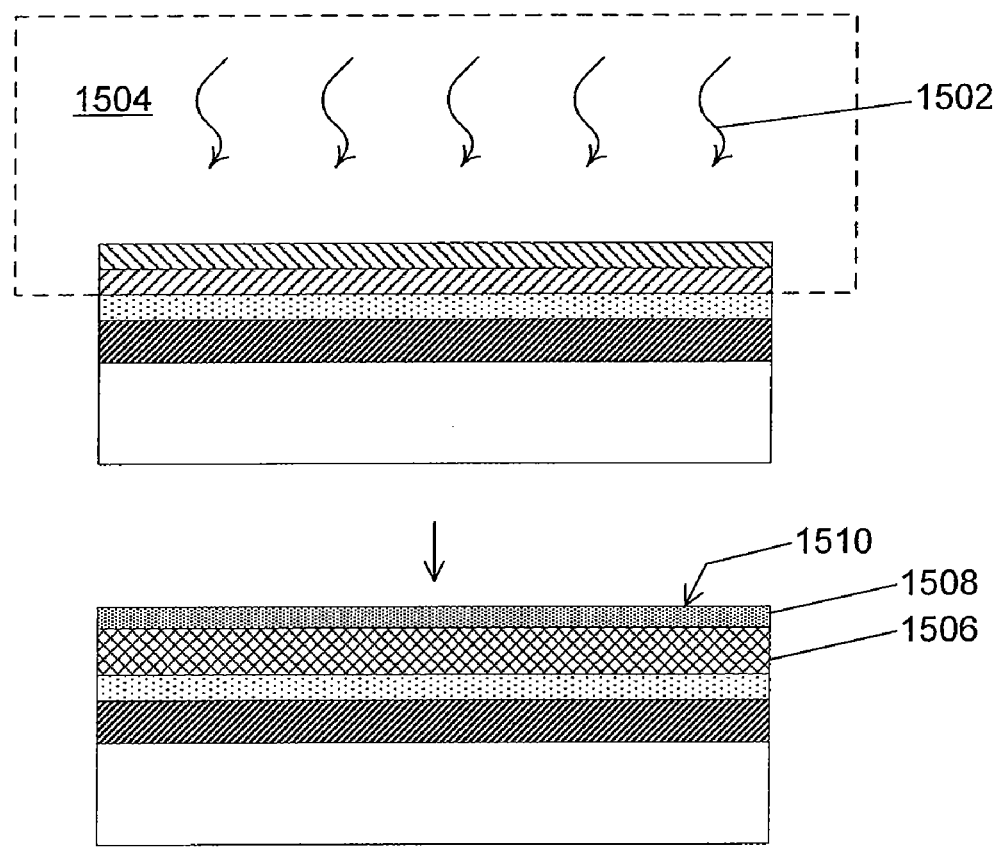

As shown in FIG. 15, the multilayered structure comprising at least an indium layer and a copper layer is subjected to a thermal treatment process 1502 in an sulfur species 1504 bearing environment. The thermal treatment process uses a rapid thermal process while the multilayer structure is subjected to the sulfur bearing species. In a specific embodiment, the rapid thermal process uses a temperature ramp rate ranging from about 10 Degrees Celsius/second to about 50 Degrees Celsius/second to a final temperature ranging from about 400 Degrees Celsius to about 600 Degrees Celsius. In a specific embodiment, the thermal treatment process further maintains at the final temperature for a dwell time ranging from about 1 minute to about 10 minutes, but can be others. The thermal treatment process also include a temperature ramp down in an inert ambient or other suitable environment that can stop the reaction of formation of the alloy material in a specific embodiment. The inert ambient can be provided using gases such as nitrogen, argon, helium, and others. Further details of the temperature ramp process is described throughout the present specification and more particularly below.

In a specific embodiment, the sulfur bearing species can be applied using a suitable technique. In an example, the sulfur bearing species are in a fluid phase. As an example, the sulfur can be provided in a solution, which has dissolved $Na_2S$, $CS_2$, $(NR_4)_2S$, thiosulfate, and others. Such fluid based sulfur species can be applied overlying one or more surfaces of the multilayered copper/indium structure according to a specific embodiment. In another example, the sulfur bearing species 210 is provided by hydrogen sulfide gas or other like gas. In other embodiments, the sulfur can be provided in a solid phase, for example elemental sulfur. In a specific embodiment, elemental sulfur can be heated and allowed to vaporize into a gas phase, e.g., $S_n$, and allowed to react with the indium/copper layers. Other sulfur bearing species may also be used depending on the embodiment. Taking hydrogen sulfide gas as the sulfur bearing species as an example. The hydrogen sulfide gas can be provided using one or more entry valves with flow rate control into a process chamber. Any of these application techniques and other combinations of techniques can also be used. The process chamber may be equipped with one or more pumps to control process pressure. Depending on the embodiment, a layer of sulfur material may be provided overlying the multilayer structure comprising the copper layer and the indium layer. The layer of sulfur material can be provided as a patterned layer in a specific embodiment. In other embodiment, sulfur material may be provided in a slurry, a powder, a solid, a paste, a gas, any combination of these, or other suitable form. Of course, there can be other variations, modifications, and alternatives.

In a specific embodiment, the thermal treatment process maintains the absorber layer substantially free from species that may diffuse from the window layer and/or the transparent conductive oxide layer. The method also eliminates using a thick window layer to protect the transparent conductive oxide layer from diffusion of species from the absorber layer. The method provides a photovoltaic cell that can have a conversion efficiency greater than about 8 percent or greater than 10 percent, and others. Of course, there can be other variations, modifications, and alternatives.

Referring again to FIG. 15, the thermal treatment process causes a reaction between copper and indium materials within the multilayered structure and the sulfur bearing species., thereby forming a layer of copper indium disulfide thin film material 1506. In one example, the copper indium disulfide thin film material is formed by incorporating sulfur ions and/or atoms evaporated or decomposed from the sulfur bearing species into the multilayered structure with indium atoms and copper atoms mutually diffused therein. In a specific embodiment, the thermal treatment process results in a formation of a cap layer overlying the copper indium disulfide material. The cap layer comprises a thickness of substantially copper sulfide material 1508 substantially free of indium atoms. The copper sulfide material includes a surface region 1510. In a specific embodiment, the formation of the copper sulfide cap layer is under a Cu-rich conditions for the Cu-In bearing multilayered structure. Depending on the embodiment, the thickness of the copper sulfide material is in an order of about five to ten nanometers and greater depending on the multilayered structure. In a specific embodiment, the thermal treatment process allows the first electrode layer to maintain at a sheet resistance of less than or equal to about 10 Ohms per square centimeters and an optical transmission of 90 percent and greater after the copper indium disulfide thin film material is formed. Of course, there can be other variations, modifications, and alternatives.

Figure 16:
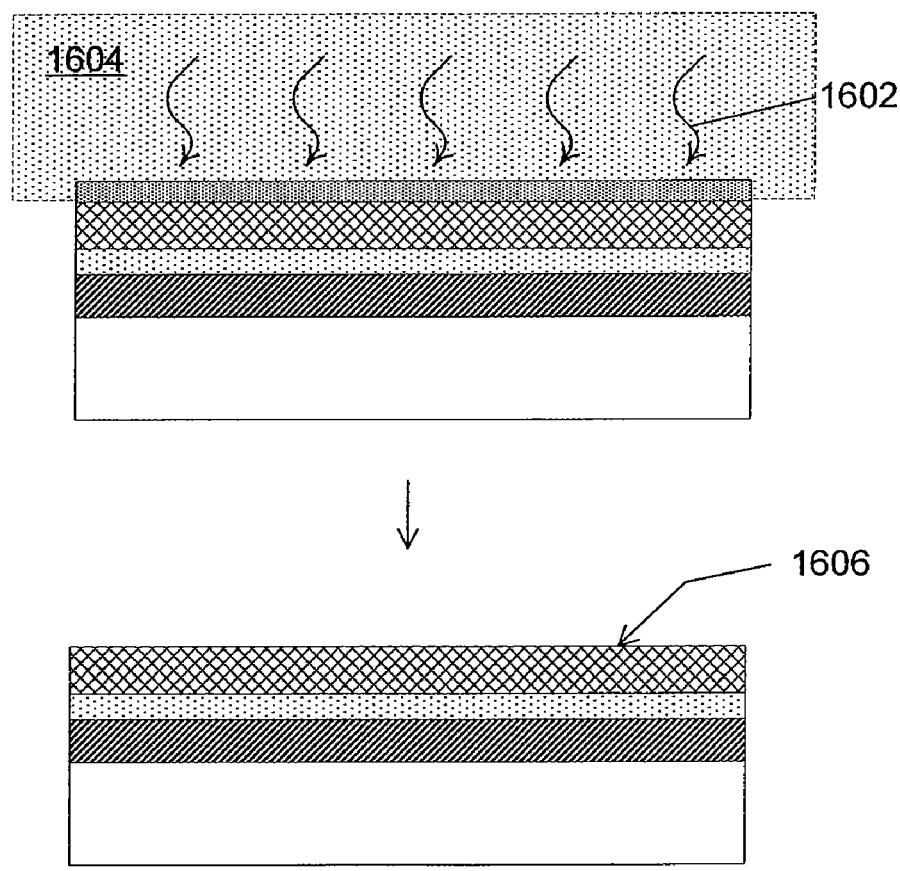

As shown in FIG. 16, the copper sulfide material is subjected to a dip process 1602. The dip process is performed by exposing the surface region of the copper sulfide material to a solution 1604 comprising potassium cyanide as an etching species at a concentration of about a 10% by weight according to a specific embodiment. Potassium cyanide solution provides an etching process to selectively remove copper sulfide material from the copper indium disulfide material surface exposing a surface region 1606 of underlying copper indium disulfide material according to a specific embodiment. In a preferred embodiment, the etching process has a selectivity of about 1:100 or more between copper sulfide and copper indium disulfide. Other etching species can be used depending on the embodiment. In a specific embodiment, the etching species can be hydrogen peroxide. In other embodiments, other etching techniques including electro-chemical etching, plasma etching, sputter-etching, or any combination of these may be used. In a specific embodiment, the copper sulfide material can be mechanically removed, chemically removed, electrically removed, or any combination of these, and others In a specific embodiment, the absorber layer made of copper indium disulfide can have a thickness ranging from about one micron to about 10 microns, but can be others. Of course, there can be other variations, modifications, and alternatives.

Figure 17:
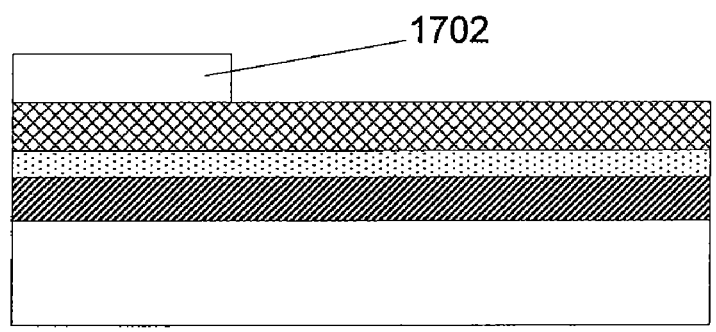

In a specific embodiment, the copper indium disulfide film has a p type impurity characteristics and provide for an absorber layer for the thin film photovoltaic cell. In certain embodiments, the copper indium disulfide material is further subjected to a doping process to adjust a p-type impurity density therein to optimize an I-V characteristic of the high efficiency thin film photovoltaic devices. For example, the copper indium disulfide material may be doped using an aluminum species. In another example, the copper indium disulfide material can be intermixed with a copper indium aluminum disulfide material to form the absorber layer. The window layer and the absorber layer forms an interface region for a PN junction associated with a photovoltaic cell. Of course, there can be other variations, modifications, and alternatives As shown in FIG. 17, the method forms a second electrode layer 1702 overlying the absorber layer. The second electrode layer can be a transparent conductive oxide (TCO) in a specific embodiment. For example, the transparent conductive oxide can be selected from a group consisting of $In_2O_3$:Sn (ITO), ZnO:Al (AZO), $SnO2$:F (TFO), but can be others. In certain embodiments, the second electrode layer may be provided using a metal material such as tungsten, gold, silver, copper or others. In other embodiments, the second electrode layer can be reflective to reflect electromagnetic radiation back to the photovoltaic cell and improves the conversion efficiency of the photovoltaic cell. Of course there can be other variations, modifications, and alternatives.

In a specific embodiment, the method includes coupling the top cell and the bottom cell to form the thin film tandem cell as illustrated in FIG. 1. In a specific embodiment, the top cell and the bottom cell may be coupled using a suitable optical transparent material such as ethyl vinyl acetate but can be others depending on the application. Of course, there can be other variations, modifications, and alternatives. In a specific embodiment, other substrate configurations are described below.

Figure 18:
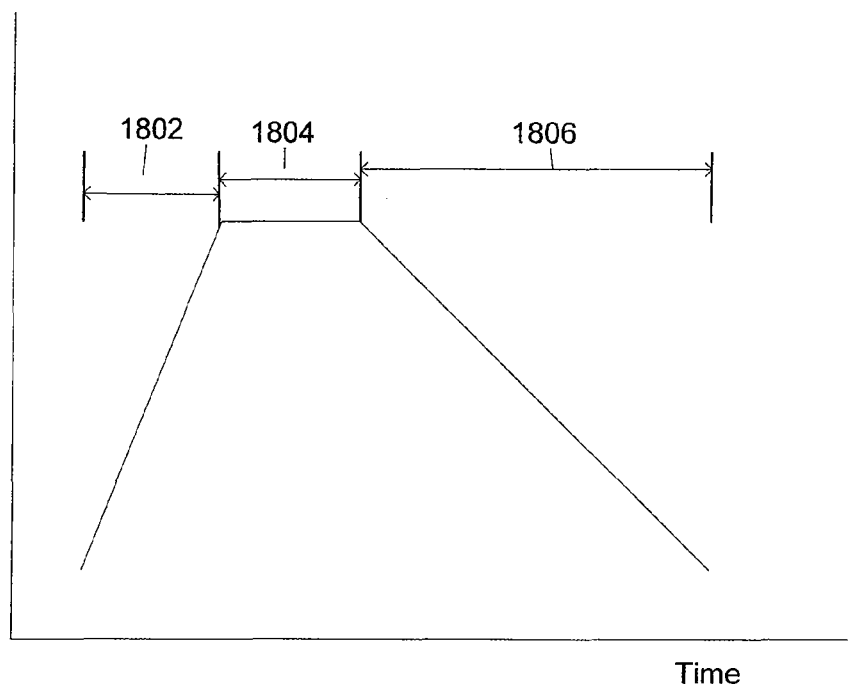
FIG. 18 is a simplified diagram illustrating a temperature profile for a thermal treatment process for forming a thin film photovoltaic device according to an embodiment of the present invention.

FIG. 18 is a simplified diagram illustrating a temperature profile 1800 for the thermal treatment process according to an embodiment of the present invention. The thermal treatment process can be a rapid thermal process in a specific embodiment. As shown, the rapid thermal process includes a temperature ramp up 1802. The temperature ramp up can have a ramp up rate ranging from about 10 Degree Celsius per second to about 50 Degree to achieve a Celsius per second and a final temperature ranging from about 450 Degree Celsius to about 600 Degree Celsius in a specific embodiment. The rapid thermal process includes a dwell period 1804. The dwell period has a dwell time ranging from about 1 minute to about 10 minutes at the final temperature in a specific embodiment. During the temperature ramp up period and the dwell period, a multilayer structure comprises of a copper material and a indium material is subjected to a sulfur species to form a copper indium disulfide material. As shown, the rapid thermal process includes a ramp down 1806. The ramp down is preferable perform in an inert environment provided by inert gases such as nitrogen, helium, or argon, and the like.

In a specific embodiment, the present rapid thermal process achieves one or more benefits. As an example, the thermal treatment process prevents poising of the absorber layer due to diffusion of species from the transparent conducting oxide and/or the window layer into the absorber layer. Additionally, the thermal treatment process also eliminates the need of using a thick window layer to prevent diffusion of species form the absorber layer into the transparent conductive oxide layer. The transparent conductive oxide layer can be maintained to have a optical transmission to be greater than 90 percent and greater than about 95%. Of course there can be other variations, modifications, and alternatives.

Figure 19:
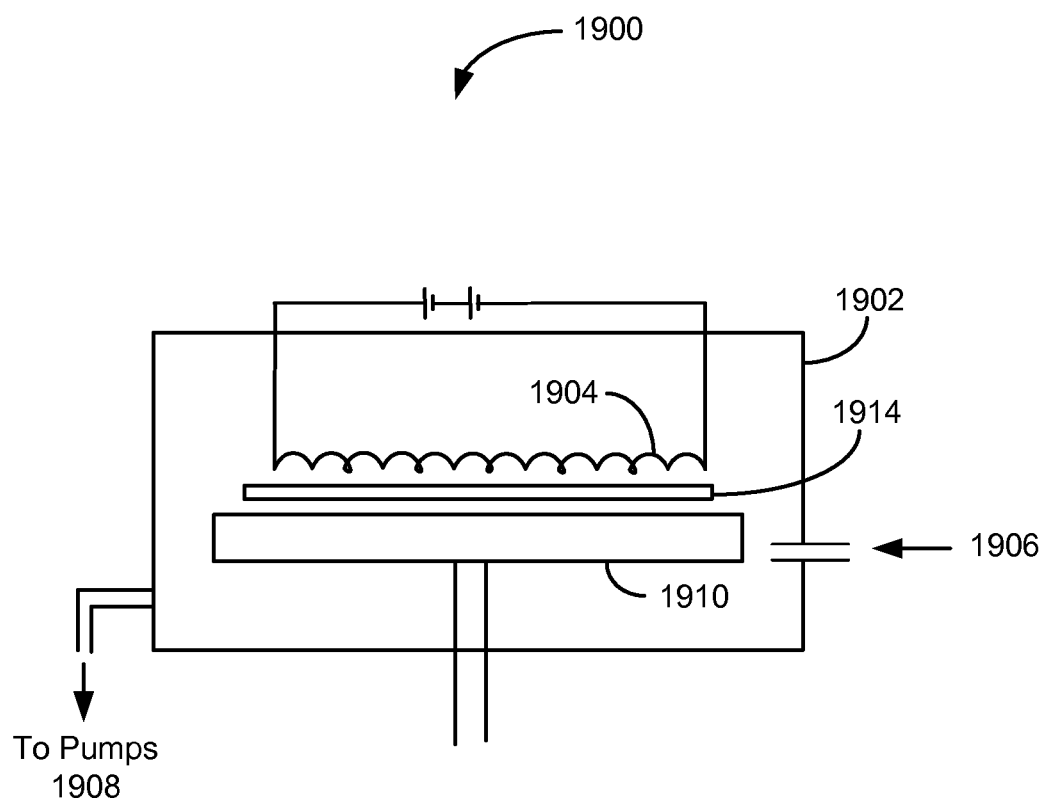
FIG. 19 is a simplified diagram illustrating an apparatus to perform the thermal treatment process for forming a thin film photovoltaic device according to an embodiment of the present invention.

FIG. 19 is a simplified diagram illustrating an apparatus 1900 for rapid thermal processing for forming the absorber layer according to an embodiment of the present invention. As shown, the apparatus includes a process chamber 1902. The apparatus includes one or more heating devices 1904 housed in the process chamber. The one or more heating devices may be provided using a light source capable of emitting light in the wavelength range characterizing an infrared. Other heating devices may also be used, depending on the application. These other heating devices may use one or more heating filament or one or more heating coils provide at suitable locations within the process chamber. In a specific embodiment, the heating device uses one or more light source capable of providing heat energy to provide the temperature profile a shown in FIG. 18. The apparatus also includes one or more manifolds 1906 which includes one or more valves to allow process gases to enter the process chamber. The apparatus includes one or more pumps 1908 to maintain a desired process pressure for a given reaction rate. As shown, a substrate 1914 is maintained on an appropriate holder 1910 during the reaction. Additionally, the apparatus can include a loading system/unloading system to move the substrate to the process chamber to perform the reaction (for example, the sulfurization reaction for forming the absorber layer) and to remove the substrate from the process after the reaction. Of course there can be other variations, modifications, and alternatives.

Figure 20:
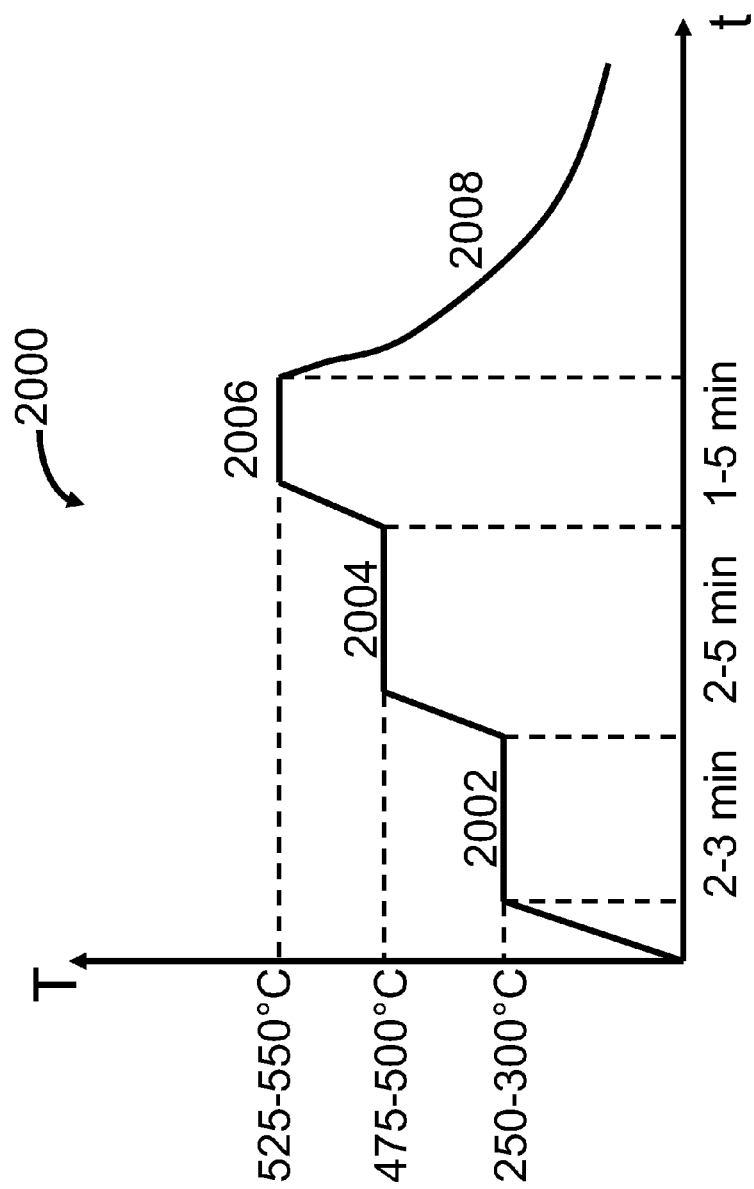
FIG. 20 is a simplified diagram illustrating a temperature profile for the rapid thermal treatment process according to an embodiment of the present invention.

FIG. 20 is a simplified diagram illustrating a temperature profile 2000 for the rapid thermal treatment process according to an embodiment of the present invention. The rapid thermal treatment process for processing an absorber layer can be performed using apparatus 1900 shown in FIG. 19. As shown, the rapid thermal treatment process includes three temperature ramp-up stages. Firstly, the temperature T in the thermal treatment apparatus 1900 can be ramped up to a first stage 2002 ending with about 250-300 Degree Celsius with a ramp up rate ranging from about 10 Degree Celsius per second. The absorber layer will be treated at the first stage 2002 with a dwell period of about 2-3 minutes. Secondly, the thermal treatment process includes ramping the temperature to a second stage 2004 at which the temperature T ends about 475 Degree Celsius to 500 Degree Celsius. At the second stage the dwell time may last for 2-5 minutes. Additionally, the rapid thermal treatment process includes another temperature ramping up to a third stage 2006 where the absorber layer is treated at the temperature about 525-550 Degree Celsius with a dwell time about 1-5 minutes. During the three-stage temperature ramp up period and corresponding dwell time period, the absorber layer, which is a multilayer structure comprising a copper material and indium (or indium-gallium) material, is subjected to a sulfur species to form a copper indium disulfide (or copper indium gallium disulfide) material. Further, the rapid thermal treatment process finishes with a ramp down process 2008. The ramp down is preferably performed in an inert environment provided by inert gases such as nitrogen, helium, or argon, and the like.

In another embodiment of the present invention, the rapid thermal treatment process shown in FIG. 20 can be replaced by a conventional thermal process (CTP) including one or more temperature ramp-up stages. The conventional thermal treatment, however, needs relative longer time to perform. Both ramping up time and dwell time for CTP process is longer than those mentioned above shown in FIG. 20. In a specific embodiment, the total process time is controlled to be less than a hour so that sulfurization of absorber layer can be performed as expected while transparent electrode layer coupled to the absorber layer will not suffer any damage or degradation in its optical and electrical properties. Of course, there can be many variations, alternatives, and modifications.

Although the above has been illustrated according to specific embodiments, there can be other modifications, alternatives, and variations. For example, the method can be used to fabricate a photovoltaic cell that has an absorber layer that forms using a high temperature process. Although the above has been described in terms of a specific absorber material, other absorber materials such as $Cu(InAl)S_2$ $Cu(InGa)S_2$, $Cu_2SnS$, $Cu_2ZnSnS_4$, SnS, any combinations of these, and others can be used. It is understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A method for forming a thin film photovoltaic device, the method comprising:
providing a transparent substrate comprising a surface region;
forming a first transparent electrode layer overlying the surface region of the transparent substrate, the first transparent electrode layer having an electrode surface region
forming a multilayered structure including a copper material and an indium material overlying the electrode surface region;
subjecting the multilayered structure to a plurality of sulfur bearing entities;
subjecting the multilayered structure to a rapid thermal process using a ramp time ranging from about 10 Degrees Celsius/second to about 50 Degrees Celsius/second during the subjecting of the sulfur bearing entities to form an absorber material comprising a copper entity, an indium entity, and a sulfur entity;
forming a cap layer overlying the absorber material;
exposing the cap layer to a solution comprising an etchant;
selectively removing a portion of the cap layer; and
maintaining the first transparent electrode layer to a sheet resistance of less than or equal to about 10 Ohms/square centimeters and an optical transmission of 90 percent and greater.

2. The method of claim 1 further comprising forming a window layer overlying the absorber layer.

3. The method of claim 1 wherein the absorber material comprises a copper indium disulfide material from at least the rapid thermal process of the multi-layered structure, the copper indium disulfide comprising an atomic ratio of copper: indium ranging from about 1:35:1 to about 1:60:1.

4. The method of claim 1 wherein the rapid thermal process having a dwell time of about 1 to 10 minutes at a final temperature ranging from about 400 Degrees Celsius to about 600 Degrees Celsius, and further comprising ramping from the final temperature to a second temperature while subjecting the absorber material to nitrogen gas or argon gas.

5. The method of claim 1 wherein the absorber material is characterized by a band gap energy of about 1.6 to about 1.9 eV.

6. The method of claim 1 wherein the absorber material is selected from a group consisting of : $CuInS_2$, $Cu(InAl)S_2$, $CuInGaS_2$, $Cu_2SnS$, or $Cu_2ZnSnS_4$.

7. The method of claim 2 wherein the window layer is selected from a group consisting of a cadmium sulfide, a zinc sulfide, zinc selenium (ZnSe), zinc oxide (ZnO), or zinc magnesium oxide (ZnMgO).

8. The method of claim 7 further comprising forming a transparent conductive oxide overlying a portion of the window layer.

9. The method of claim 1 wherein the copper material is provided before the indium material.

10. The method of claim 1 further comprising coupling the thin film photovoltaic device to a second thin film photovoltaic device, the thin film photovoltaic device is a top cell and the second thin film photovoltaic device is a bottom cell.

11. The method of claim 1 wherein the thin film photovoltaic cell is characterized by a conversion efficiency greater than about 8%.

12. A method for forming a thin film photovoltaic device, the method comprising:
providing a transparent substrate comprising a surface region;
forming a first transparent electrode layer overlying the surface region of the transparent substrate, the first transparent electrode layer having an electrode surface region;
forming a window layer overlying the first transparent electrode layer;

forming a multilayered structure including a copper material and an indium material overlying the window layer;

subjecting the multilayered structure to a plurality of sulfur bearing entities;

subjecting the multilayered structure to a rapid thermal process using a ramp time ranging from about 10 Degrees Celsius/second to about 50 Degrees Celsius/second during the subjecting of the sulfur bearing entities to form an absorber material comprising a copper entity, an indium entity, and a sulfur entity;

forming a cap layer overlying the absorber material, the cap layer comprising substantially of copper sulfide material;

exposing the cap layer to a solution comprising an etchant;

selectively removing a portion of the cap layer; and maintaining the first transparent electrode layer to a sheet resistance of less than or equal to about 10 Ohms/square centimeters and an optical transmission of 90 percent and greater.

13. The method of claim 12 wherein the absorber material comprises a copper indium disulfide material from at least the rapid thermal process of the multi-layered structure, the copper indium disulfide comprising an atomic ratio of copper:indium ranging from about 1:35:1 to about 1:60:1.

14. The method of claim 12 wherein the rapid thermal process having a dwell time of about 1 to 10 minutes at a final temperature ranging from about 400 Degrees Celsius to about 600 Degrees Celsius, and further comprising ramping from the final temperature to a second temperature while subjecting the absorber material to nitrogen gas or argon gas.

15. The method of claim 12 wherein the absorber material is characterized by a band gap energy of about 1.6 to about 1.9 eV.

16. The method of claim 12 wherein the absorber material is selected from a group consisting of: $CuInS_2$, $Cu(InAl)S_2$, $CuInGaS_2$, $Cu_2SnS$, or $Cu_2ZnSnS_4$.

17. The method of claim 12 wherein the window layer is selected from a group consisting of a cadmium sulfide, a zinc sulfide, zinc selenium (ZnSe), zinc oxide (ZnO), or zinc magnesium oxide (ZnMgO).

18. The method of claim 12 wherein the copper material is provided before t the indium material.

19. The method of claim 12 further comprising coupling the thin film photovoltaic device to a second thin film photovoltaic device, the thin film photovoltaic device is a top cell and the second thin film photovoltaic device is a bottom cell.

20. The method of claim 12 further comprising forming a second electrode layer overlying the absorber material.

21. The method of claim 20 wherein the second electrode layer is comprises a transparent electrode material.

22. The method of claim 12 wherein the thin film photovoltaic cell is characterized by a conversion efficiency greater than about 8%.

23. A method for treating a photovoltaic thin film, the method comprising:

providing a transparent substrate comprising a surface region;

forming a first transparent electrode layer overlying the surface region, the first transparent electrode layer having an electrode surface region;

forming a window layer overlying the first transparent electrode layer;

forming a multilayer structure comprising copper species and indium species overlying the window layer;

subjecting the multilayer structure to a thermal treatment process using a ramp rate about 10 Degrees Celsius per second ramping from room temperature to a first stage at about 250 to 300 Degrees Celsius followed by a second stage at about 475-500Degrees Celsius and a third stage at about 525-550 Degrees Celsius, wherein the thermal treatment process is performed in a sulfur bearing environment for transforming the multilayer structure to a photovoltaic absorber material comprising copper, indium, and sulfur species;

forming a cap layer overlying the photovoltaic absorber material, the cap layer comprising substantially of copper sulfide material;

exposing the cap layer to a solution comprising an etchant;

selectively removing a portion of the cap layer; and maintaining the first transparent electrode layer to a sheet resistance of less than about 10 Ohms/$cm^2$ and an optical transmission of 90 percent and greater by controlling dwell time at each of the first stage, the second stage, and the third stage.

* * * * *